United States Patent [19]

Hanna

[11] 4,346,354
[45] Aug. 24, 1982

[54] AMPLITUDE MODULATOR USING VARIABLE WIDTH RECTANGULAR PULSE GENERATOR

[75] Inventor: George D. Hanna, Dallas, Tex.

[73] Assignee: Continental Electronics, Inc., Dallas, Tex.

[21] Appl. No.: 191,898

[22] Filed: Sep. 29, 1980

[51] Int. Cl.³ .......................... H03C 1/02; H03C 1/50
[52] U.S. Cl. .................................. 332/43 B; 332/9 R; 332/41; 332/48; 375/22; 375/41; 455/108
[58] Field of Search .............. 332/9 R, 9 T, 10, 31 R, 332/31 T, 41, 43 R, 43 B, 48; 375/22, 41-43; 455/108, 109

[56] References Cited

U.S. PATENT DOCUMENTS

| | | | |
|---|---|---|---|
| 2,445,568 | 7/1948 | Ferguson | 332/13 |
| 2,498,711 | 2/1950 | Royden | 330/119 |
| 3,068,421 | 12/1962 | Duerdoth | 332/9 T X |
| 3,072,854 | 1/1963 | Case, Jr. | 332/9 R X |
| 3,075,136 | 1/1963 | Jones | 363/139 |
| 3,170,127 | 2/1965 | Cramer | 332/41 |
| 3,225,303 | 12/1965 | Hauber | 332/9 T X |
| 3,245,006 | 4/1966 | Runyan | 332/43 |
| 3,363,199 | 1/1968 | Besslich | 332/10 |
| 3,978,424 | 8/1976 | Hobo et al. | 331/45 |
| 4,319,204 | 3/1982 | Weldon et al. | 332/9 R |

FOREIGN PATENT DOCUMENTS 1024441 3/1966 United Kingdom .
1111646 5/1968 United Kingdom .

OTHER PUBLICATIONS

Raab, "Radio Frequency Pulsewidth Modulation", IEEE Transactions on Communications, Aug. 1973, pp. 958–966.
"Electronics", vol. 49, No. 1, Oct. 14, 1976, p. 100.
Hitachi HI-Fet Power MOS Fet Application Notes, Hitachi H-1279.
"Principles of Inverter Circuits", Bedford and Haft, J. Wiley and Sons, 1964, pp. 234–237.
IEE Transactions on Broadcasting, vol. BC.21, No. 2, Jun. 1975, pp. 25–31.
Instruments and Experimental Techniques, vol. 20, No. 3, May/Jun. 1977, pp. 740, 741.

Primary Examiner—Siegfried H. Grimm
Attorney, Agent, or Firm—Nolte and Nolte

[57] ABSTRACT

A method and apparatus for amplitude modulating a carrier signal with an audio or information input signal utilizes an arcsine generator to cause the envelope of the carrier to follow the input signal. The invention stems from the realization that if rectangular pulses of bipolar amplitude are symmetrically centered about 0 and $\pi$ radians of the carrier signal, the harmonic content can be expressed as a function of the angle of the rectangular pulses. This concept is realized by producing two opposite phase carrier signals which are compared with the modulation input signal to form two opposite phase rectangular pulse signals whose pulse widths are a function of the modulation input signal. Alternate phase pulses are extracted from these two rectangular pulse signals by two NOR gates, and the extracted pulses are combined and filtered to obtain an amplitude modulated output signal.

11 Claims, 8 Drawing Figures

AMPLITUDE MODULATOR USING VARIABLE WIDTH RECTANGULAR PULSE GENERATOR

BACKGROUND OF THE INVENTION

The present invention relates to a system for producing a square wave output signal having variable phase in relation to a fixed reference signal and, more specifically, relates to a transformer coupled circuit employing logic elements for producing such variable phase square wave signals.

It is known to produce a pulse width modulated signal by varying the duration of the output voltage pulses of the two signals that are applied to an inverter circuit. Typically, in such inverter circuits silicon controlled rectifiers are employed and are triggered on for a time interval equal to a half cycle of the voltage wave.

A similar circuit is taught for varying the relative phases of two square wave signals, so that they may be used as control signals in an ampliphase kind of amplitude modulation circuit. That system is described in U.S. Pat. No. 4,319,204 assigned to the assignee hereof. Disclosed in that application is an exciter used with a pair of amplifier circuits having a common output circuit for producing the desired amplitude modulated output signal. The exciter is employed to control the relative phases of the control signals fed to the pair of amplifier circuits.

The intended result in all of such exciter systems is to produce two square wave signals which have a mutual phase relationship based upon a varying level input signal, such as an audio signal.

SUMMARY OF THE INVENTION

The present invention realizes that if rectangular pulses of bipolar amplitude are symmetrically centered about 0 and $\pi$ radians on a time axis, the harmonic content can be expressed as a function of the angle, i.e., the phase angle, of the rectangular pulses on the time axis. The present invention has discovered that if the pulse width in radians of the rectangular pulse varies linearly, the peak of the fundamental wave will vary as a sine function. The present invention further shows that if pulses having a width of $\theta$ in radians are bipolar and centered around 0 and $\pi$, the amplitude of the fundamental wave will be given by the curve generated by an arcsine function generator.

Moreover, the present invention has found that if the pulses can be generated a great number of times for each small change in the curve, then the peaks of the fundamental wave will form an envelope which matches the amplitude of the normalized arcsine signal at all points between 0 and 1 (normalized). The present invention provides a system for generating these pulses. Specifically, an arcsine generator is provided such that the absolute value of a sine wave is compared with a varying level signal and a pulse is generated at the times when the amplitude of the fundamental wave of the absolute value of the sine wave does not exceed the amplitude of the varying level signal to which it is compared. This results in the production of a unipolar pulse train and, if alternate or even numbered pulses are inverted, then the originally desired signal, i.e, rectangular pulses of bipolar amplitude symmetrically centered around 0 and $\pi$ radians, will be produced.

By use of the present invention, information, i.e., a varying signal representing information, can be impressed upon the fundamental frequency wave. In the case of a voltage signal, it can be used as an amplitude modulation method to transmit information, provided that the time variation of the information is less than the time variation of the fundamental frequency of the carrier wave. This, of course, is a limitation present in almost all modulation systems.

In one embodiment of the present invention, the switches used to generate the constant amplitude pulses are arranged such that they are on only for the length of time necessary to produce the required pulse width and are off for the remainder of the time. Additionally, such switches may be operated in the saturated or cut-off mode, thereby minimizing power consumption in the switch. Accordingly, such switches are easily driven since they are either on completely or off completely. In one embodiment of the present invention, a filter is used in the output circuit of the switches to extract only the fundamental wave from the output.

Accordingly, it is an object of the present invention to provide a system for producing two rectangular wave signals whose pulse widths are based on an amplitude varying signal fed to the system, wherein the two rectangular waves can be combined and processed to reproduce the original amplitude varying signal.

Another object of the present invention is to provide a method and circuit for impressing information onto a fundamental frequency wave, employing a simulation of an arcsine generator.

The manner in which these and other objects are accomplished by the present invention will become clear from the following detailed description.

DETAILED DESCRIPTION OF THE INVENTION

Figure 1:
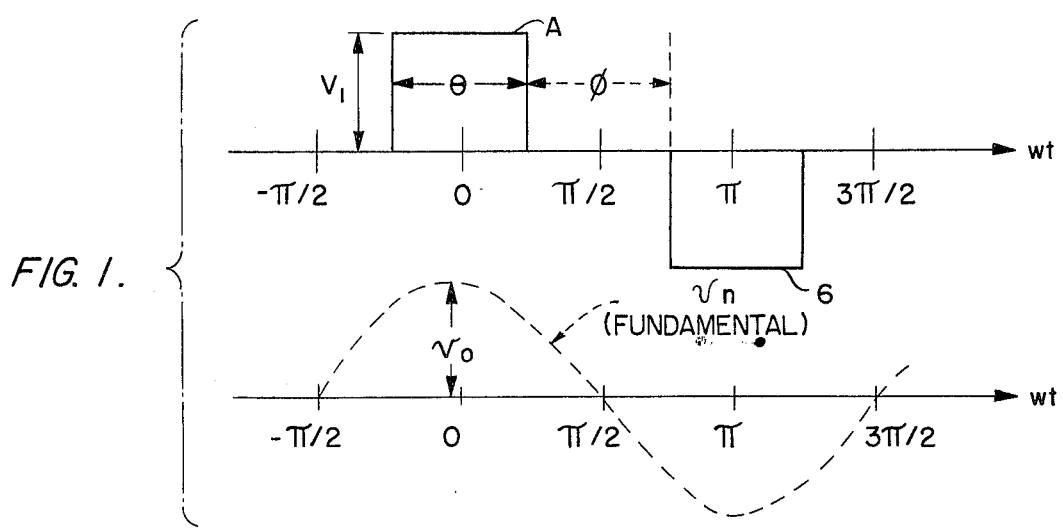
FIG. 1 is two waveforms, the first showing bipolar square wave pulses with the second being a fundamental sine wave.

Referring now to FIG. 1, bipolar square wave pulses are shown in the uppermost waveform of FIG. 1. As may be seen, the pulses 4, 6 are rectangular pulses of bipolar amplitude and are centered about 0 and $\pi$ radians on the time axis $\omega t$. The harmonic content of these bipolar rectangular pulses can be expressed as a function of the pulse angle (the pulse width $\theta$) of the rectangular pulse. Reference is then made to the lower waveform in FIG. 1, which shows the amplitude of the nth harmonic. Referring specifically to the lower waveform of FIG. 1, $v_n$ is the fundamental wave and may be shown mathematically as follows.

$$v_n = \frac{2}{\pi} \int_0^\pi V_1 \cos_n \omega t \, d(\omega t) \quad (1)$$

where: $\phi$ is the interpulse width in radians; $v_n$ is the amplitude of the nth harmonic; $\theta$, the pulse width in radians $= \pi - \phi$; $v_o$ is the peak amplitude of the fundamental wave; $V_1$ is the pulse amplitude during $\theta$ and is 0 during $\phi$.

The peak amplitude $v_o$ of the fundamental $V_n$ is described by:

$$v_o = \frac{4}{\pi} \int_0^{\theta/2} V_1 \cos \omega t \, d(\omega t) \quad (2)$$

where: $0 < \theta \leq \pi$, $$v_o = \frac{4}{\pi} V_1 \left[ \sin \frac{\pi}{2} t \right]_0^{\theta/2} = \frac{4}{\pi} V_1 \sin \frac{\theta}{2} \quad (3)$$

When $\theta = 180° = \pi$, and $\phi = 0$;

$$v_o = \frac{4}{\pi} V_1 \sin \pi/2 = \frac{4}{\pi} V_1$$

Solving for $\theta$, $$\theta = 2 \arcsin \frac{(v_o \pi)}{4 V_1} \quad (4)$$

Based upon the above equations, the invention shows in equations (3) and (4) that if the pulse angle or pulse width $\theta$ in radians is varied linearly, the amplitude $v_o$ of the fundamental wave will vary as a sine function. Once this relationship is discovered it can be seen that if $\theta$ can be made to vary as 2 arcsine of another value, say $e_a$, then:

$$\theta = 2 \arcsin e_a \quad (5)$$

when $e_a$ varies from 0 to 1.

Figure 2:
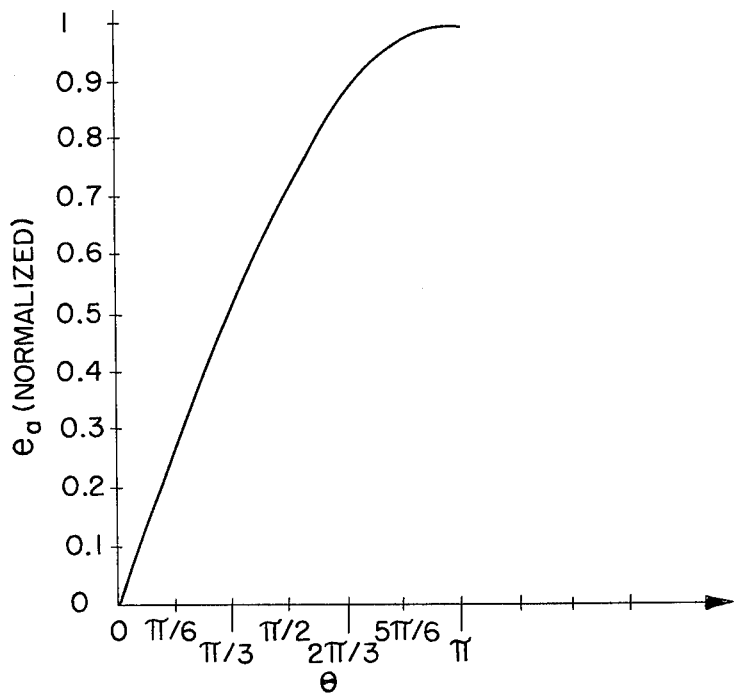
FIG. 2 is a plot of a normalized variable function versus square wave pulse width.

Referring then to FIG. 2, the graph of $e_a$ versus $\theta$ is shown. As may be seen, if the pulses of width $\theta$ are bipolar and centered around 0 and $\pi$, the amplitude of the fundamental wave $v_o$ is equal to $e_a$ between 0 and 1. Thus, the present invention has discovered that if pulses could be generated a large number of times for each small change in $e_a$, the peak value of $v_o$ would form an envelope, which would match the $e_a$ amplitude at all points between 0 and 1. The present invention provides a method and apparatus to accomplish this goal.

Specifically, in equations (4) and (5), it may be seen that $$\theta = 2 \arcsin (v_o \pi / 4 V_1) \quad (4)$$

$$\theta = 2 \arcsin e_a \quad (5)$$

Setting equations (4) and (5) equal to each other, it is seen that:

$$2 \arcsin (v_o \pi / 4 V_1) = 2 \arcsin e_a$$

which simplifies to:

$$v_o \pi / 4 V_1 = e_a \quad (6)$$

As can be seen, this equation (6) is linear. Thus, it is an object of the present invention to provide an arcsine generator, whose importance is seen from the preceding analysis, which also teaches an approach by which the generator may be implemented.

If the absolute value of a sine function, $\sin \omega t$, is compared to any other function sample of amplitude $e_a$, where $0 < e_a < V_o(\max)$, then a pulse can be generated at two points $\omega t_1$ and $\omega t_2$. Referring then to the preceding analysis, the time period existing between $\omega t_2 - \omega t_1$ is $\theta$, which occurs when the amplitude of $v_o$ does not exceed the amplitude of the curve $e_a$.

Figure 3:
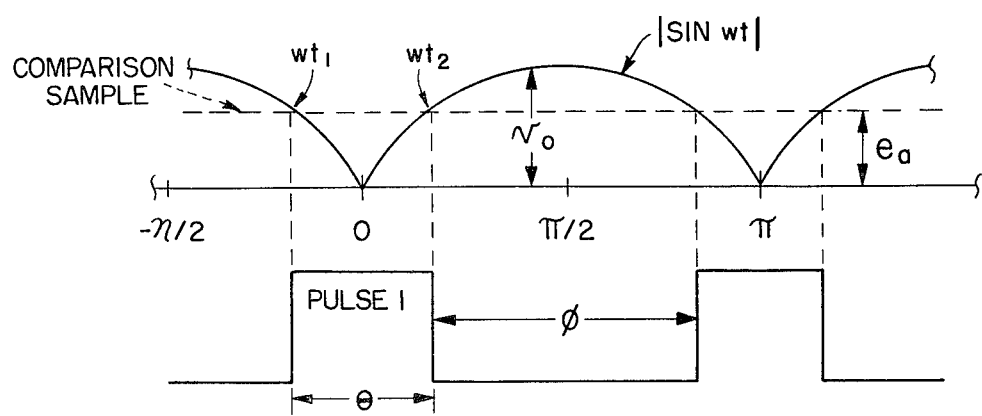
FIG. 3 is two waveforms, the first showing an absolute value sine wave and a comparison sample with the second being a pulse output signal produced by the embodiment of FIG. 4.

In FIG. 3 it may be seen that the absolute value of the sin $\omega t$ function has points which fall below the comparison sample, i.e., below the level of the varying signal $e_a$, and that such points are symmetrical about 0 and $\pi$. Accordingly, the lower trace of FIG. 3 represents unipolar pulses, which are centered about 0 and $\pi$. The present invention teaches inverting the even-numbered pulses, so that the resultant waveform is made up of symmetrically centered, rectangular bipolar pulses, the harmonic content of which can be represented by the angle of the rectangular pulse. Taking the lowermost waveform of FIG. 3, and assuming that every even-numbered pulse is inverted, the amplitude of the fundamental wave in this bipolar pulse train is then equal to $e_a$. Therefore, as $e_a$ is varied from 0 to $V_o\max$, the fundamental wave peak $v_a$ will correspond to the sample $e_a$ magnitude.

If the time variation rate of the sample $e_a$ is less than the time variation rate of the absolute value of the $\sin \omega t$ function, then the peak of the fundamental wave $V_a$, will form an envelope or surface tangent to the fundamental curve. This envelope is then a reproduction of $e_a$. The present invention teaches that the technique described above can be used to impress information upon the fundamental frequency wave. Specifically, in the case of voltage waves, it can be used as an amplitude modulation method to transmit information of substantially any form. The only constraint being that the time variation of the information signal must be less than the fundamental frequency.

Moreover, in the preferred embodiment of the present invention, when utilizing semiconductor switches to produce the constant amplitude $V_1$ pulses, advantages are obtained since the switches are on in a constant state only for the length of time necessary to provide the required pulse width and are off for the remainder of the time. Additionally, such semiconductor switches are operated in the saturated mode not in the linear mode, thereby minimizing wasted power in the switch. Power in the switch is calculated as being the product of the voltage across the switch times the current through the switch during the conduction period. Therefore, in the saturated mode the voltage across the switch is minimized. Another advantage provided by the utilization of semiconductor switches in the preferred embodiment to produce the $V_1$ pulses is that the switches are easily driven, since they are either completely on or completely off.

Figure 4:
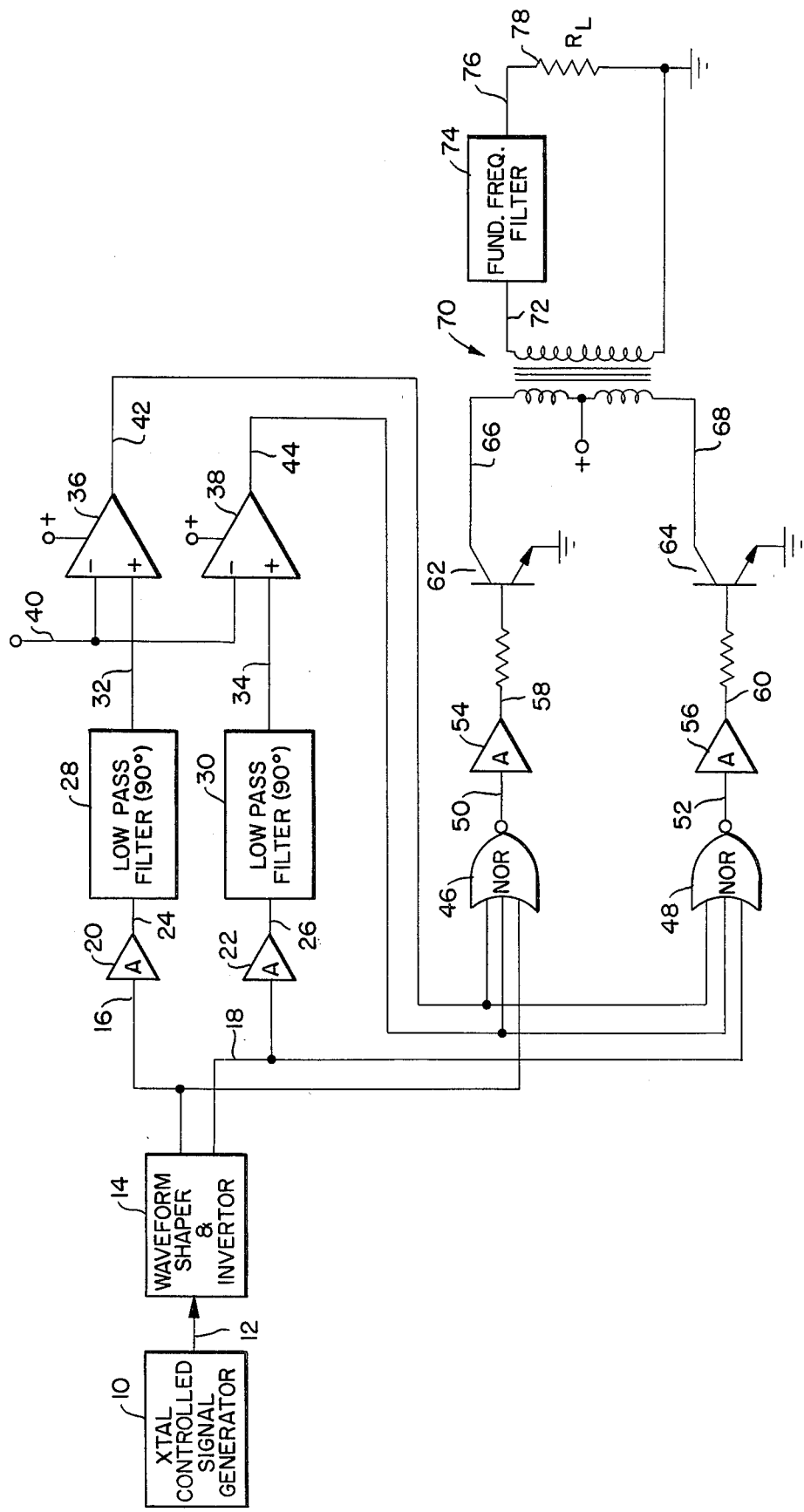
FIG. 4 is a circuit diagram in schematic form of a preferred embodiment of the present invention.

Referring then to FIG. 4, a circuit embodying the present invention is shown. Specifically, a crystal controlled signal generator 10 produces a signal on line 12 having a frequency of 1.04 MHz. The signal is fed to a waveform shaper and inverter 14, which produces a square wave signal on line 16 and the complement of that square wave signal on line 18. These square wave signals are amplified in amplifiers 20 and 22, respectively, and the amplified square wave signal on line 24 and its complement on line 26 are then fed to low-pass filters 28 and 30, respectively, which have the effect of providing a phase shift of 90°. The output signal of low-pass filter 28 on line 32, and the output signal from low-pass filter 30 on line 34 are 180° out of phase with each other. These two signals on lines 32 and 34 are fed to the noninverted inputs of high-speed comparator units 36 and 38, respectively. These comparator units 36, 38 are biased in the conventional manner.

The inverting inputs of the comparators 36, 38 are connected to the same signal source via line 40. It is this signal source which represents the input information which is to be reproduced as the envelope of the 1.04 MHz carrier signal. In an experimental setup of this embodiment the signal appearing on line 40 was varied between zero and the amplitude of the positive peak of the carrier wave. In such setup, the comparators 36, 38 were set to produce an output pulse during the time that the carrier wave amplitude was greater than the amplitude of the signal appearing on line 40. Because the triggering level signals on lines 32 and 34 fed to the two comparators 36, 38 are 180° out of phase with each other, the pulses produced by the comparators 36, 38 will be equal in time duration but will be centered around points which are displaced from each other by $\pi$ radians of the carrier signal frequency. The position of these pulses is as shown in FIG. 1. The alternate phase pulses are then extracted from these two signals by the use of two NOR gates, 46 and 48. In addition to the output signals on lines 42, 44 from the comparators 36, 38 these NOR gates 46, 48 have additional inputs of the original square wave signal on line 16 fed to NOR gate 46 and the complement of the original signal on line 18 fed to NOR gate 48. The two NOR gates 46, 48 perform the Boolean algebra function of averaging the sum of the input signals.

In order to correctly phase the input signals so as to obtain correct operation of the desired Boolean algebraic functions, the low-pass filters, 28 and 30, provide a 90° phase shift of the input signals. This permits the proper phasing for operation of the NOR gates. The output signals from the NOR gates 46, 48 on lines 50 and 52, respectively, are amplified in amplifiers 54, 56 and fed through base drive resistors 58 and 60 to power amplifiers, represented by transistors 62 and 64. The biasing networks for these amplifiers are not shown. The output lines 66, 68 from these transistor amplifiers 62, 64 are connected to the primary of an output transformer 70. The secondary 72 of transformer 70 is fed through a filter 74, which filters out the fundamental frequency of the produced signal so that ultimately the signal is fed to the desired load, as represented by the resistor 78. It is understood, of course, that the load 78 may comprise an antenna.

Figure 5:
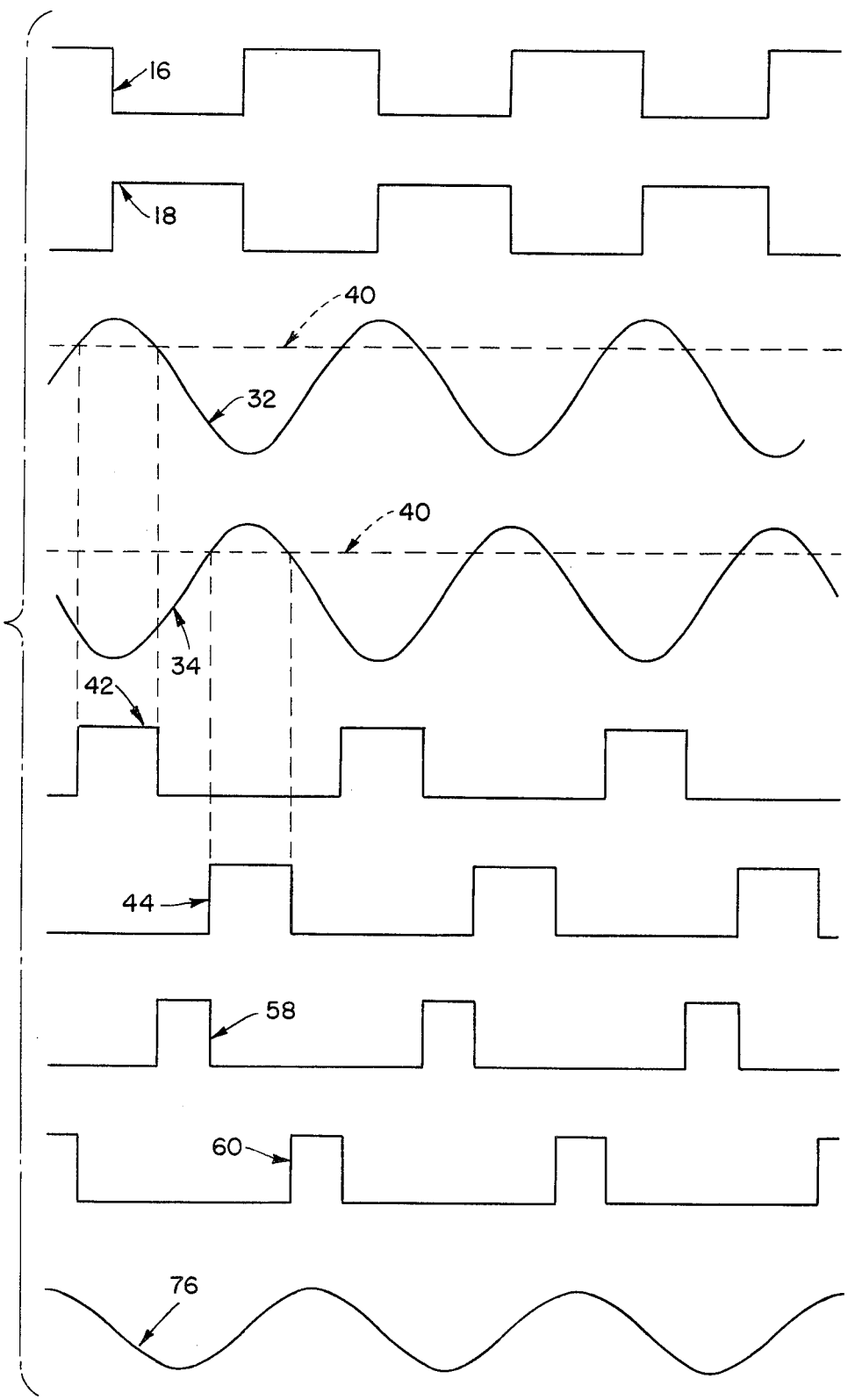
FIG. 5 is a series of waveforms obtained at specific locations in the circuit of FIG. 4.

In order to appreciate more fully the operation of the present invention, the waveforms of the various signals at points throughout the circuit of FIG. 4 are shown in FIG. 5. The numerals in FIG. 5 indicate the signals appearing on the corresponding lines in the circuit of FIG. 4. Specifically, the square wave 16 in the uppermost waveform of FIG. 5 represents the signal appearing on line 16 and its complement appears below it on line 18. The signals appearing on these lines are then shaped and phase shifted by the two 90° low-pass filters 28, 30 to produce sine waves which are 180° out of phase and are represented by the waveforms 32, 34. These signals act as variable threshold signals and are fed to the noninverting inputs of the comparator units 36, 38 which have as other inputs the variable signal appearing on line 40. While in FIG. 5, signal 40 appears to be a constant, nevertheless, it is pointed out the the rate of change of the information or audio signal should be substantially less than the rate of change of the carrier signal. Thus, in FIG. 5 the signal on line 40 appears as a constant in relation to the much higher frequency carrier signals on lines 32 and 34. The outputs of the comparators 36, 38 on lines 42 and 44 represent output pulses which were produced during the time that the carrier signal amplitudes on lines 32 and 34 were greater than the varying information or audio signal on line 40. Such correlation can be seen from the waveforms of FIG. 5 by comparing the portion of waveform 32 above the wave 40 and the location of the first signal pulse on line 42. The outputs from the two comparators, as well as the original squarewave signal and its complement, are then fed to NOR gates to produce the output signal. Because the output of the logic devices are not of a sufficient level to drive the transistor amplifiers it is necessary to place an additional amplifier stage at the output of these logic devices; however, it is understood that the logical output remains the same.

NOR gate 46 operates to produce an output pulse only when all three of its inputs are low. Thus, as may be seen in FIG. 5 when waveform 16 is low, waveform 42 is low, and waveform 44 is low, a pulse will be produced appearing on line 58. Similarly, when waveform 18 is low, waveform 42 is low, and waveform 44 is low, a pulse will be produced on line 60. These pulses then are amplified and fed to the primary of the transformer 70 and upon filtering out the fundamental frequency, the envelope of the desired audio signal is on line 76.

Figure 6A:
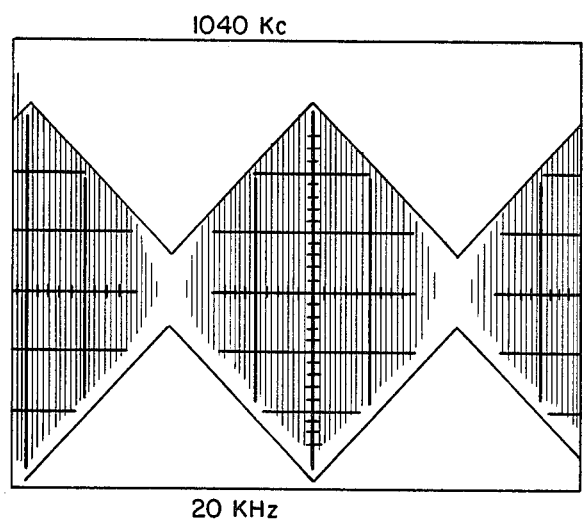
FIGS. 6($a$), 6($b$) and 6($c$) are representations of actual photographic samples of waveforms present during the operation of the embodiment of FIG. 4.
Figure 6B:
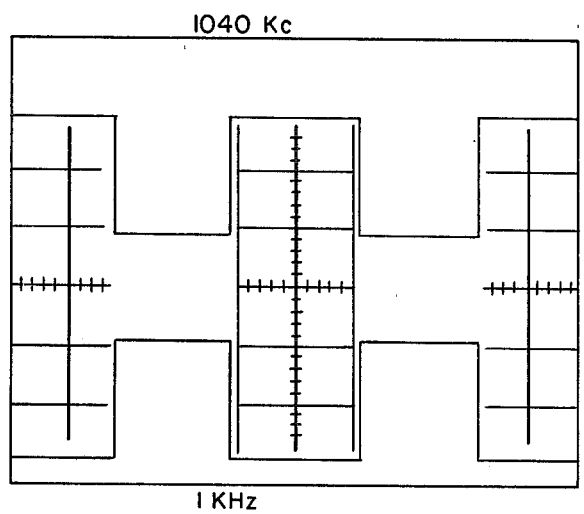
Figure 6C:
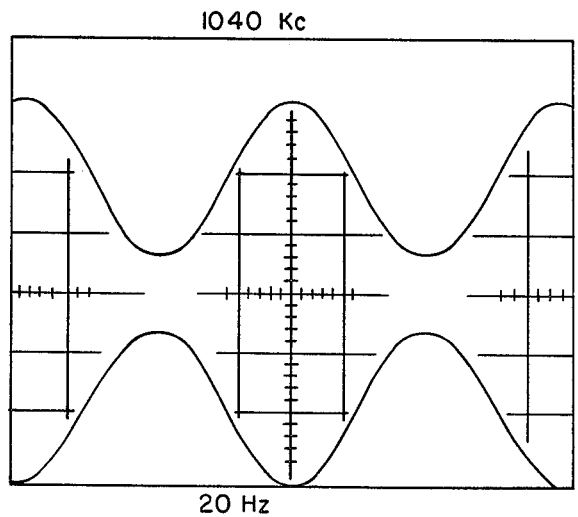

As a further showing of the operation of the present invention, photographs of actual output signal envelopes with various audio input signals are shown in FIGS. 6(a) to 6(c). All photos were taken using a carrier of 1.04 MHz. FIG. 6(a) shows the signal appearing on line 76 after having the fundamental frequency filtered out. This output envelope in FIG. 6(a) was produced by a triangular waveform audio input signal of 20 KHz being input on line 40. FIG. 6(b) shows the envelope of the signal on line 76 after the fundamental frequency has been filtered out. This envelope in FIG. 6(b) was produced with a carrier of 1040 KHz and a square wave audio input signal on line 40 of 1 KHz. FIG. 6(c) shows the sinusoidal envelope of the signal on line 76 after the fundamental frequency has been filtered out. This output envelope was produced with a carrier frequency of 1040 KHz and a sinusoidal audio input signal of 20 Hz on line 40.

It is understood that the foregoing is presented by way of example only and is not intended to limit the scope of the present invention, except as set forth in the appended claims.

For example, circuit arrangements other than the specific one shown in FIG. 4 may be utilized. Also, in addition to the 90° phase shift low-pass filter employed, another filter having zero phase shift could also be employed. It is also possible to use full-wave rectification of the carrier in order to produce the lower waveform of FIG. 3. In that situation, the comparator inputs would be reversed. It has been found through experimentation using lower frequencies and high voltage levels than those discussed above that the full wave rectification approach will function acceptably.

What I claim is:

1. A system for impressing a varying level signal on a carrier signal, comprising:
   pulse producing means for producing pulses when the carrier signal amplitude is greater than the amplitude of the varying level signal;
   timing means connected to said pulse producing means for causing said pulses to be produced at times corresponding to zero and $\pi$ radians at the carrier frequency;
   means connected to said pulse producing means for extracting every other successive pulse produced by said pulse producing means and for producing a resultant signal; and
   means for extracting the fundamental frequency from the resultant signal, whereby as the varying level signal is varied from zero to the maximum of the amplitude of the carrier signal, the fundamental frequency wave peaks will correspond to the varying level signal.

2. The system of claim 1, wherein said pulse producing means comprises variable threshold comparator means having the varying level signal fed to the threshold setting inputs and square wave signals at the carrier frequency fed to the remaining terminals of said variable threshold comparator means.

3. The system of claim 1, wherein said means for extracting every other successive pulse includes logical NOR gate means.

4. The system of claim 1, wherein said timing means includes 90° phase shift low-pass filter means.

5. Apparatus for impressing the information in a varying level signal onto the fundamental frequency of a carrier signal, comprising:
   means for supplying a carrier signal;
   phase shift means for shifting said carrier signal in phase by a predetermined amount;
   comparator means connected to receive said carrier signal, said phase shifted carrier signal, and a varying level information signal, for producing first signal pulses when the amplitude of said carrier signal is greater than the amplitude of said information signal and second signal pulses when the amplitude of said phase shifted carrier signal is greater than the amplitude of said information signal;
   means connected to said carrier signal, said phase shifted carrier signal, said first signal pulses, and said second signal pulses for producing a first logical pulsed output signal when said carrier signal and said first signal pulses and said second signal pulses are low and for producing a second logical pulsed output signal when said phase shifted carrier, said first signal pulses and said second signal pulses are all low; and
   means for combining said first and second logical pulsed output signals to produce an output signal, whereby the fundamental frequency wave peaks will correspond to the information signal.

6. The apparatus of claim 5, wherein said phase shift means comprises means for producing the phase shifted carrier signal as the complement of the carrier signal.

7. The apparatus of claim 5, wherein said means for supplying the carrier signal comprises a square wave signal generator.

8. The apparatus of claim 5, wherein said means for producing said first and second logical pulsed output signals comprise first and second logical NOR gates.

9. The apparatus of claim 5, wherein said means for combining said first and second logical output signals comprises a center tapped transformer.

10. The apparatus of claim 9 further comprising a filter connected to the secondary of said transformer for extracting the fundamental frequency.

11. A method for impressing an information signal on a carrier signal, comprising the steps of;
   producing pulses when the carrier signal amplitude is greater than the information signal amplitude;
   causing said pulses to be produced at times corresponding to zero and $\pi$ radians on the time continuum of the carrier signal;
   inverting every other consecutive pulse of said produced signal, and producing a resultant signal therefrom;
   extracting the fundamental frequency from the resultant signal, whereby when the information signal is varied from zero to the maximum of the carrier signal, the fundamental frequency wave peaks correspond to the information signal.

* * * * *